United States Patent
Li

(10) Patent No.: US 11,469,556 B2
(45) Date of Patent: Oct. 11, 2022

(54) STRUCTURALLY IMPROVED CURRENT LEAKAGE INTERRUPTER

(71) Applicant: LUEN MING ELECTRIC WORKS COMPANY LIMITED, Kowloon (HK)

(72) Inventor: Hin Yeung Li, Kowloon (HK)

(\*) Notice: Subject to any disclaimer, the term of this patent is extended or adjusted under 35 U.S.C. 154(b) by 323 days.

(21) Appl. No.: 16/718,214

(22) Filed: Dec. 18, 2019

(65) Prior Publication Data

US 2021/0194189 A1 Jun. 24, 2021

(51) Int. Cl.
| | | |
|---|---|---|
| *H01R 13/713* | (2006.01) | |
| *H02H 1/00* | (2006.01) | |
| *H01R 13/04* | (2006.01) | |
| *H01R 13/502* | (2006.01) | |
| *H02H 7/22* | (2006.01) | |
| *H05K 1/18* | (2006.01) | |

(52) U.S. Cl.
CPC .......... *H01R 13/713* (2013.01); *H01R 13/04* (2013.01); *H01R 13/502* (2013.01); *H02H 1/0007* (2013.01); *H02H 7/22* (2013.01); *H05K 1/18* (2013.01); *H05K 2201/10053* (2013.01); *H05K 2201/10303* (2013.01)

(58) Field of Classification Search
CPC .. H01R 13/04; H01R 13/502; H01R 13/6683; H01R 13/713; H01R 24/66; H02H 1/0007; H02H 3/335; H02H 7/22; H05K 1/18; H05K 1/182; H05K 2201/09063; H05K 2201/10053; H05K 2201/10265; H05K 2201/10303
See application file for complete search history.

(56) References Cited

U.S. PATENT DOCUMENTS

| | | | | |
|---|---|---|---|---|
| 5,862,029 A | * | 1/1999 | Nicol | H01H 83/02 |
| | | | | 361/45 |
| 8,824,110 B2 | * | 9/2014 | Zou | H01R 13/7135 |
| | | | | 361/42 |
| 2008/0094764 A1 | * | 4/2008 | Zhang | H01R 13/6691 |
| | | | | 29/729 |
| 2010/0046128 A1 | * | 2/2010 | Wang | H01H 83/14 |
| | | | | 361/42 |
| 2012/0052702 A1 | * | 3/2012 | Zou | H01R 13/7135 |
| | | | | 439/95 |

(Continued)

FOREIGN PATENT DOCUMENTS

CN 209896322 U * 1/2020

*Primary Examiner* — Jared Fureman
*Assistant Examiner* — Nicolas Bellido
(74) *Attorney, Agent, or Firm* — Prakash Nama; Global IP Services, PLLC

(57) ABSTRACT

Current leakage interrupter, having a shell consisting of an upper shell and a lower shell, a PCB inside the shell, a detection device and a trip device mounted to the PCB, power lines electrically connected to the trip device through the detection device, and pins electrically connected to the trip device. The lower shell has pin holes; front ends of the pins extend out of the pin holes. A reverse hook is provided at an inner side of the lower shell at an edge of each pin hole to fix onto a first side of a rear end of a corresponding pin; a second side of the rear end of each pin is extended and bended into a bended portion; a supporting seat is also provided at the inner side of the lower shell at the edge of each pin hole to support the bended portion of the corresponding pin.

10 Claims, 11 Drawing Sheets

(56) References Cited

U.S. PATENT DOCUMENTS

2014/0139955 A1* 5/2014 Ye .................... H01R 13/7135
361/42
2015/0116872 A1* 4/2015 Li .................... H01R 13/713
361/42

* cited by examiner

NOTE:
1. LA5D(TYPE C1), R1A=R1B=R1C=R1D, 30KΩ;
2. LA5S(TYPE C1), R1A=R1B(without R1C,R1D) 51KΩ;
3. R5*, Adjusts sensitivity of detection;

STRUCTURALLY IMPROVED CURRENT LEAKAGE INTERRUPTER

BACKGROUND OF THE INVENTION

The present invention relates to the technical field of current leakage interrupter, and more specifically relates to a kind of current leakage interrupter.

With the increasing popularity of household appliances, people are paying more and more attention to the safety of household appliances. At present, many household appliances are equipped with leakage protectors at the input end of the power supply. The leakage interrupter detects "residual current". The working principle is that the two power lines (live and neutral) of the plug are simultaneously inserted into a central hole of a specialized "zero current transformer". When power consumption of the electric appliance is normal, the current flowing through the live line and the current flowing through the neutral line are completely equal, with one current in, and another current out, and the current transformer has no voltage output generated. When there is "residual current" in the circuit, the two power lines inserted into the current transformer have imbalanced current, and a voltage signal proportional to the current is generated at the output of the "current transformer". As long as the voltage signal is sufficiently large, the voltage signal will be processed such as amplification by an integrated circuit of a specialized PCB, and then a silicon controlled rectifier on the trigger board is switched from off to on, so that a trip coil connected in series to the circuit in concern is energized, thereby enabling the main circuit trip unit to be disconnected to protect personal safety of a person that may come into contact with the power source.

A currently available current leakage interrupter in the market is structurally deficient in respect of the following aspects: According to the products in the market, when the copper pins are inserted into the lower shell, the copper pins press tightly against the lower shell such that the copper pins cannot be retracted or withdrawn. However, when due to reasons like stress on plastic material for a long period of time, deficient injection molding material, and temperature increase when the copper pins are loaded etc, the stress on the plastic material is increased, causing the lower shell to crack.

In view of the disadvantages in the prior art, and in view of the fact that some current leakage interrupters in the market fail to serve their functions due to defective production, the present invention has made mechanical modifications of a current leakage interrupter such that its quality is improved by improving its structural design, and thus reducing its defects.

BRIEF SUMMARY OF THE INVENTION

To solve the above technical problems, the present invention provides a kind of current leakage interrupter. By modifying the connecting structure between the pins and the shell, the stress on the lower shell is effectively reduced, thereby lowering the risk of cracking of the lower shell. The present invention improves the quality of the current leakage interrupter by structural improvements of the same, thereby reducing defects of the same.

To fulfill the above objects, the present invention has the following technical solutions: a current leakage interrupter, comprising a shell formed by mutual connection of an upper shell and a lower shell, a printed circuit board (PCB) provided inside the shell, a detection device and a trip device mounted to the PCB, power lines electrically connected to the trip device through the detection device, and pins electrically connected to the trip device; the lower shell is opened with pin holes; front ends of the pins extend out of the pin holes; a reverse hook is provided at an inner side of the lower shell at an edge of each pin hole to fix tightly onto a first side of a rear end of a corresponding pin; a second side of the rear end of each pin is extended and bended into a bended portion; a supporting seat is also provided at the inner side of the lower shell at the edge of each pin hole to support the bended portion of the corresponding pin; press strips are provided at an inner side of the upper shell to abut against the respective bended portions of the pins.

Specifically, each bended portion of a corresponding pin is bended at said second side of the rear end of the corresponding pin, bending away from the trip device; a rear end of the bended portion has an extension towards said first side of the rear end of the corresponding pin, and a connecting rod is provided at the extension; a hollow space is formed between said first side of the rear end of the corresponding pin and the connecting rod; a rear end of the connecting rod has a conical shape, and the connecting rod is inserted into the PCB.

Specifically, the trip device comprises a reset button, a reset spring, an actuator, a L slider, moving contact arms, and solenoid assembly; the reset button is configured to pass through the PCB and is spring loaded against the PCB via the reset spring; the actuator abuts against a front side of the lower shell; the actuator is provided with a buckling groove; the L slider is provided with a sliding head; the solenoid assembly is provided on the PCB and connected to the L slider; the solenoid assembly drives the L slider to move so that the sliding head is released along the buckling groove; the reset button is provided with a locking groove; the sliding head is provided with a locking portion that locks and holds onto the locking groove; one end of each moving contact arm is fixedly connected to the detection device, and another end of each moving contact arm is resiliently in contact with the actuator; when the sliding head of the L slider locks and holds onto the locking groove of the reset button, said another end of each moving contact arm is electrically in contact with the bended portion of a corresponding pin.

Specifically, the solenoid assembly comprises a solenoid bobbin, a solenoid spring, and a linkage shaft; the solenoid bobbin is sleeved with an electromagnetic coil; the linkage shaft is disposed inside the solenoid bobbin; two ends of the solenoid spring abut against an inner wall of the solenoid bobbin and one end of the linkage shaft respectively; another end of the linkage shaft is connected to the L slider.

Specifically, two sides of the actuator are each provided with a protrusion; said another end of each moving contact arm is provided with a notch fitted with the corresponding protrusion.

Specifically, the detection device comprises a transformer; said one end of each moving contact arm extends to pass through a center part of the transformer; the power lines are electrically connected with the moving contact arms.

Specifically, the transformer comprises an outer shell, a ring-shaped metal magnetic core, a low voltage winding assembly, and a high voltage winding assembly; the ring-shaped metal magnetic core is placed at a center part of the outer shell; the low voltage winding assembly winds around the ring-shaped metal magnetic core; each of two opposite sides of the outer shell is fixedly provided with two metal pins; the high voltage winding assembly winds around the ring-shaped metal magnetic core for one to two times, and the two ends of the high voltage winding assembly are connected with the two metal pins respectively at one of the two opposite sides of the outer shell, and two ends of the low voltage winding assembly are connected with the two metal pins respectively at another one of the two opposite sides of the outer shell; by filling using epoxy resin, the outer shell is formed integrally with the ring-shaped metal magnetic core, the low voltage winding assembly and the high voltage assembly; the metal pins and the PCB are electrically connected.

Specifically, the outer shell comprises a base board and an enclosure provided on the base board; a center part of the base board is provided with a hollow column; the ring-shaped metal magnetic core sleeves around hollow column; said one end of each moving contact arm extends to pass through the hollow column; snap holes are provided on the base board; a snap fit is provided on each moving contact arm to insert into a corresponding snap hole; the inner side of the lower shell is provided with a fixing column; two side surfaces of the fixing column are provided with fixing grooves respectively; said one end of each moving contact arm which is extended is provided with a fixing rib cooperating with a corresponding fixing groove; when the hollow column sleeves onto the fixing column, the fixing rib of each moving contact arm 45 fitted into the corresponding fixing groove of the fixing column.

Specifically, the power lines are connected with the moving contact arms through wire connection terminals; one side of each wire connection terminal is provided with riveting press pieces that connect a corresponding power line by riveting or spot welding; another side of each wire connection terminal is provided with an insertion piece inserted into a gap between a corresponding moving contact arm and the hollow column.

Specifically, a wire press block and a wire press seat that cooperate to press against the power lines are provided inside the shell; a wire press groove is provided on the wire press seat; each of two side walls of the wire press seat is provided with a wire locking groove that is in communication with the wire press groove; the wire press block 521 is mounted into the wire press groove; each of two side walls of the wire press block is provided with a wire locking block that locks into a corresponding wire locking groove.

The present invention has the following beneficial effects: when the pins are inserted into the pin holes of the lower shell, the reverse hooks on the lower shell will ensure that the pins are fixed and cannot return towards a direction from which the pins are inserted. Moreover, the press strips on the upper shell press against the bended portions of the pins to also ensure that the pins will not return towards a direction from which the pins are inserted. Since the rear ends of the pins are bended to form an L shape, when the pins are hung to point downwardly, the supporting seats provided on the lower shell can effectively support the bended portions of the pins to ensure that the pins 6 will not fall off. Under normal operating conditions, there is no exertion of excessive force, so as to ensure that the lower shell is not subject to stress, while also ensuring that the pins are fixed in place when inserting or removing the pins. By using the structures described above to fix the pins, stress on the lower shell is reduced, so that the lower shell can be prevented from cracking. The present invention improves the quality of the current leakage interrupter by structural improvements of the same, thereby reducing defects of the same.

REFERENCE NUMBERS IN THE FIGURES

1—shell; 2—PCB; 3—detection device; 4—trip device; 5—power lines; 6—pins; 11—upper shell; 12—lower shell; 111—press strips; 121—pin holes; 122—reverse hook; 123—supporting seat; 124—sliding groove; 125—fixing column; 1251—fixing grooves; 31—outer shell; 32—ring-shaped metal magnetic core; 33—low voltage winding assembly; 34—high voltage winding assembly; 35—metal pins; 311—base board; 312—enclosure; 313—hollow column; 3111—snap holes; 41—reset button; 42—reset spring; 43—actuator; 44—L slider; 45—moving contact arms; 46—solenoid assembly; 47—test button; 48—test button spring; 411—locking groove; 431—buckling groove; 432—protrusion; 441—sliding head; 442—locking portion; 451—notch; 452—snap fit; 453—fixing rib; 461—solenoid bobbin; 462—solenoid spring; 463—linkage shaft; 51—wire connection terminals; 511—riveting press pieces; 512—insertion piece; 521—wire press block; 5211—wire locking block; 522—wire block seat; 5221—wire press groove; 5222—wire locking groove; 53—cord bushing; 61—bended portion; 62—connecting rod; 63—hollow space.

DETAILED DESCRIPTION OF THE INVENTION

Figure 1:
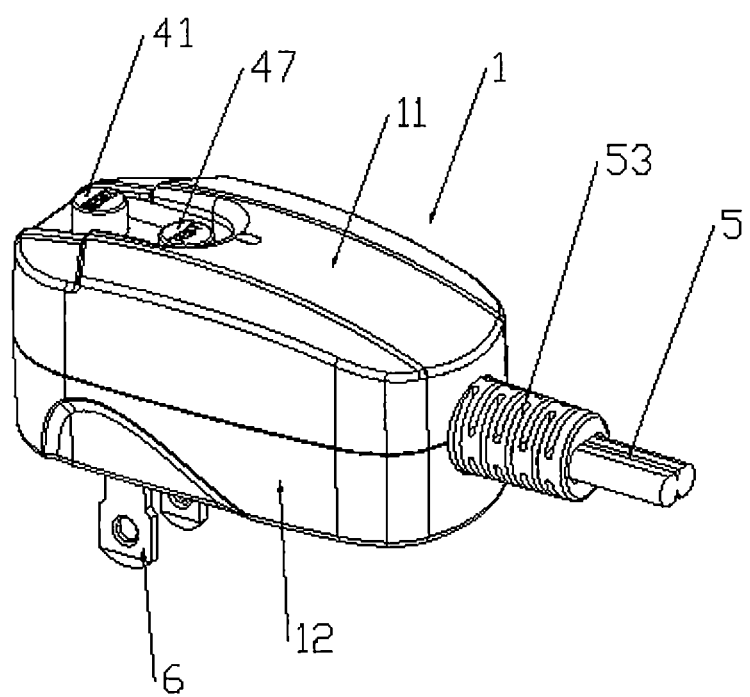
FIG. 1 is a schematic structural view of the present invention.
Figure 2:
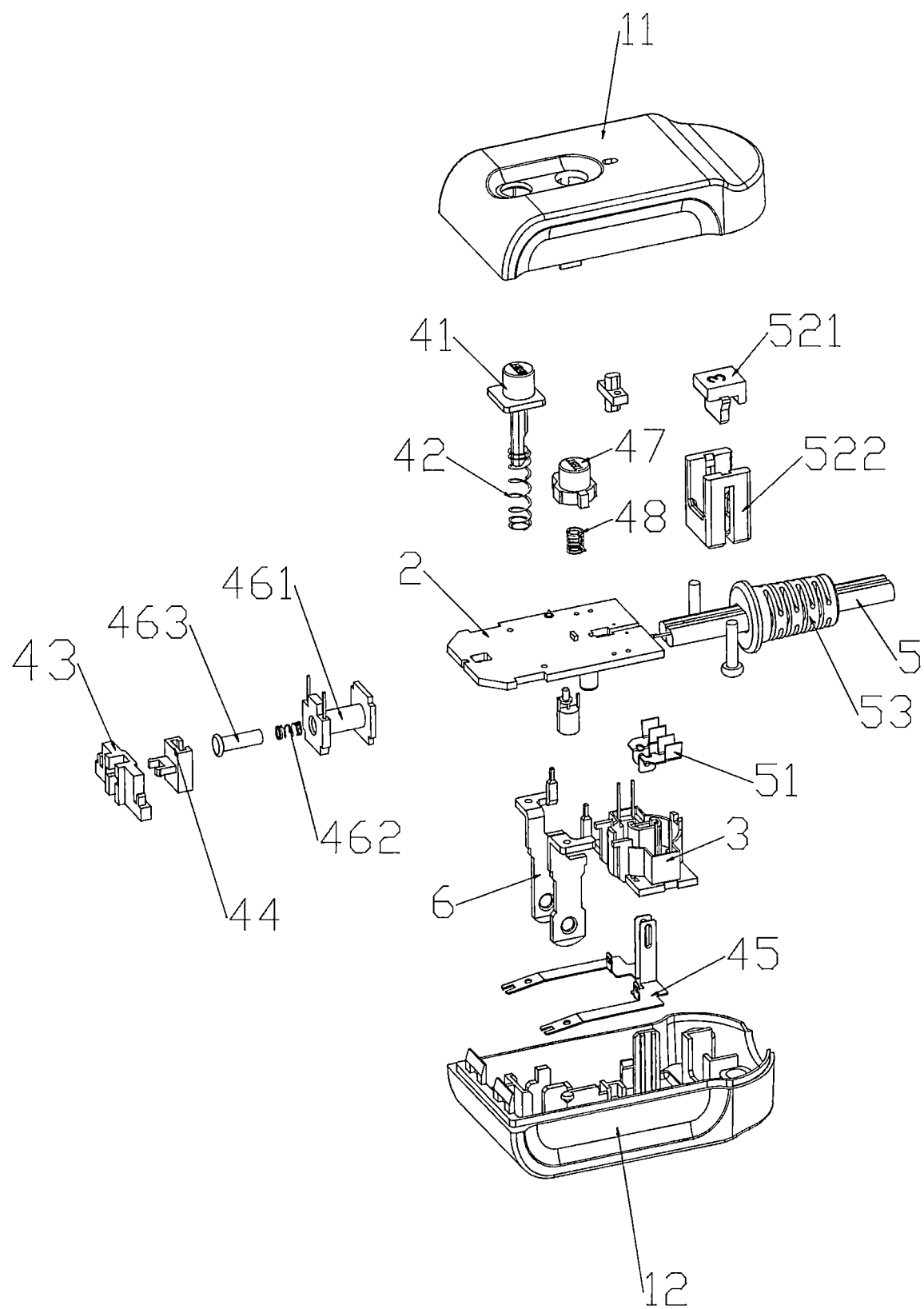
FIG. 2 is an exploded view of the present invention.
Figure 3:
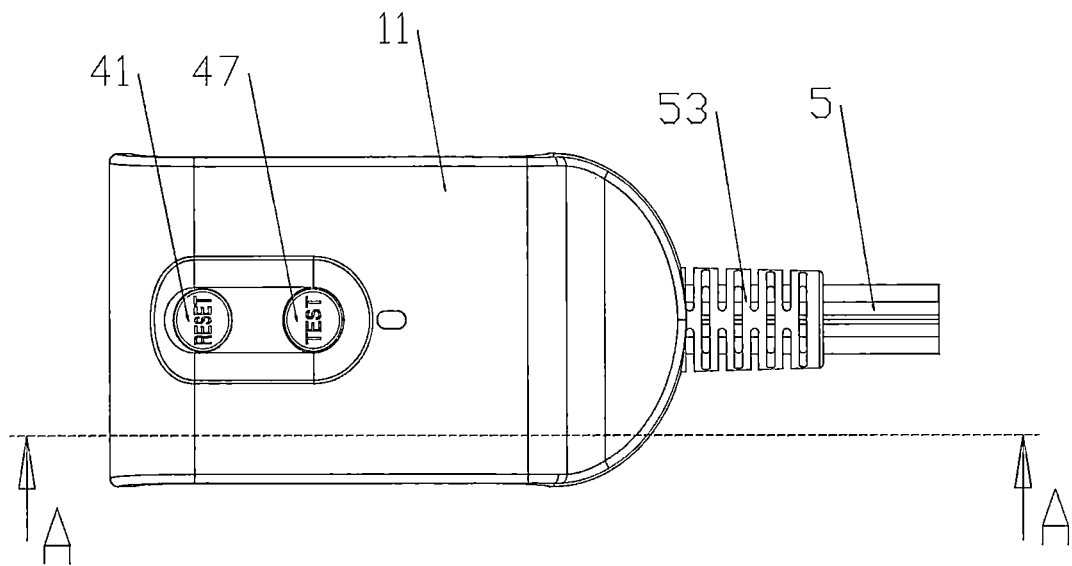
FIG. 3 is a top plan view of the present invention.
Figure 4:
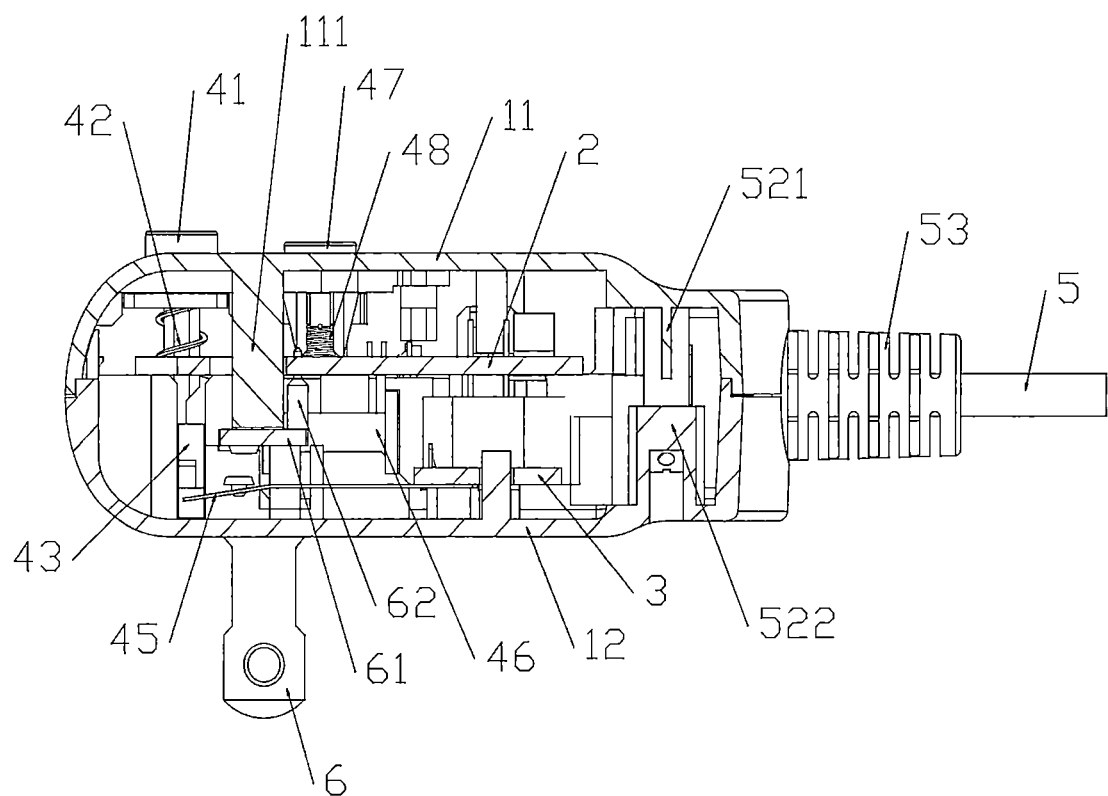
FIG. 4 is a sectional view along line A-A of FIG. 3.
Figure 5:
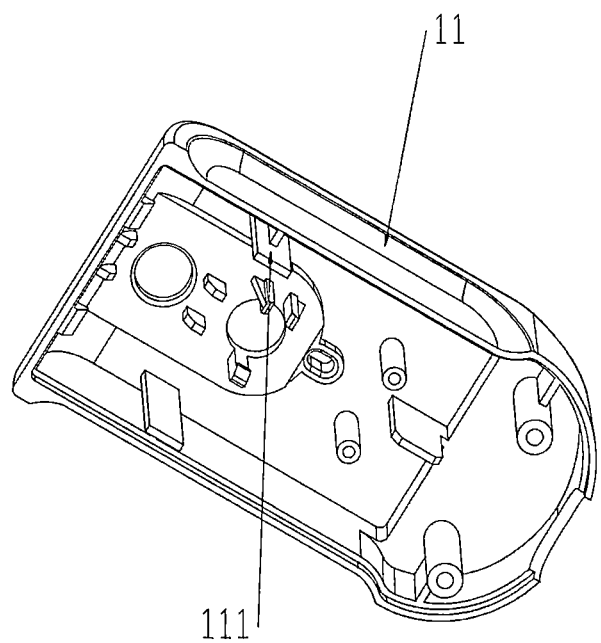
FIG. 5 is a schematic structural view of an inner side of the upper shell of the present invention.
Figure 6:
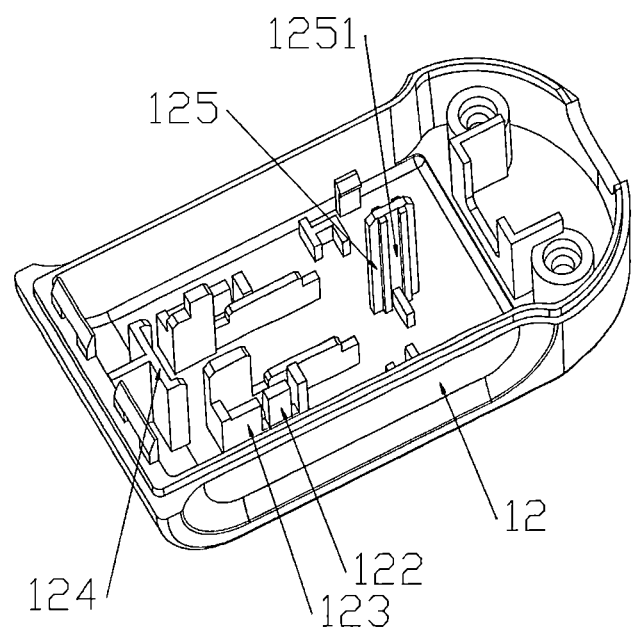
FIG. 6 is a schematic structural view of an inner side of the lower shell of the present invention.
Figure 7:
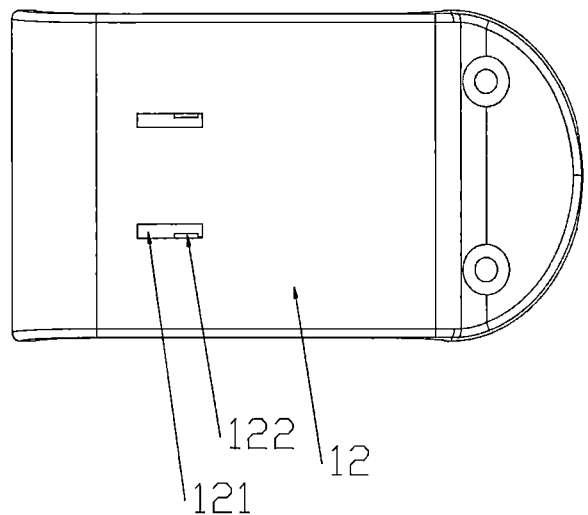
FIG. 7 is a bottom plan view of the present invention.
Figure 8:
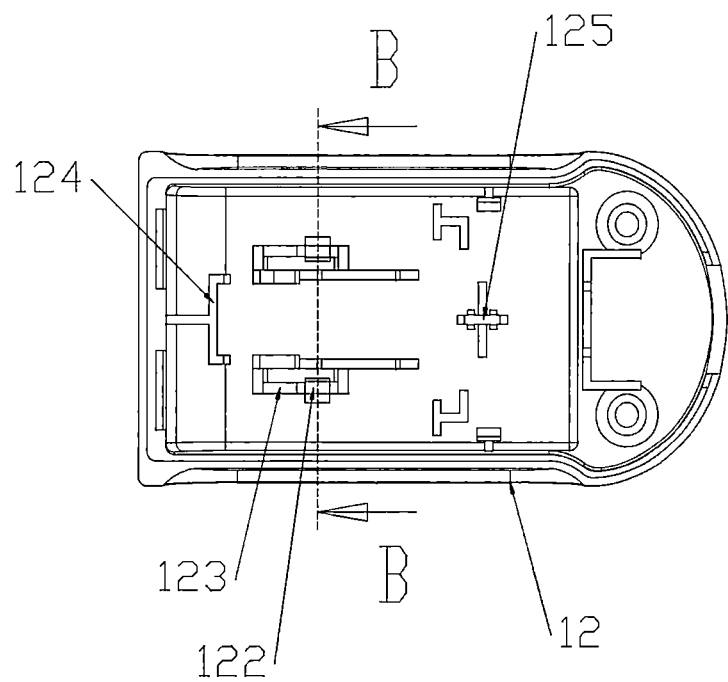
FIG. 8 is a front view of the inner side of the lower shell of the present invention.
Figure 9:
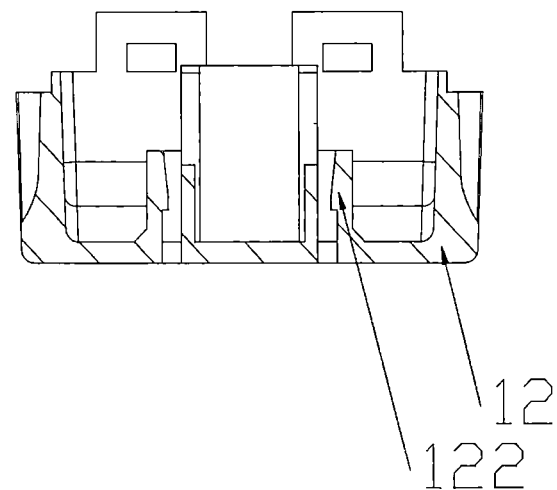
FIG. 9 is a sectional view along line B-B of FIG. 8.

FIGS. 1-2 illustrate a current leakage interrupter according to the present invention, comprising a shell 1 formed by mutual connection of an upper shell 11 and a lower shell 12, a printed circuit board (PCB) 2 provided inside the shell 1, a detection device 3 and a trip device 4 mounted to the PCB 2, power lines 5 electrically connected to the trip device 4 through the detection device 3, and pins 6 electrically connected to the trip device 4. With reference to FIGS. 3-10, the lower shell 12 is opened with pin holes 121; front ends of the pins 6 extend out of the pin holes 121; a reverse hook 122 is provided at an inner side of the lower shell 12 at an edge of each pin hole 121 to fix tightly onto a first side of a rear end of a corresponding pin 6; a second side of the rear end of each pin 6 is extended and bended into a bended portion 61; a supporting seat 123 is also provided at the inner side of the lower shell 12 at the edge of each pin hole 121 to support the bended portion 61 of a corresponding pin 6; press strips 111 are provided at an inner side of the upper shell 11 to abut against the respective bended portions 61 of the pins 6.

In the present embodiment, the pins 6 are copper pins; when the upper shell 11 and the lower 12 are connected, the supporting seats 123 and the press strips 111 act together to clamp tightly the bended portions 61 of the pins 6.

According to the present embodiment, when the pins 6 are inserted into the pin holes 121 of the lower shell 12, the reverse hooks 122 on the lower shell 12 will ensure that the pins 6 are fixed and cannot return towards a direction from which the pins are inserted. Moreover, press strips 111 (plastic ribs) on the upper shell 11 press against the bended portions 61 of the pins 6 to also ensure that the pins will not return towards a direction from which the pins are inserted. Since the rear ends of the pins 6 are bended to form an L shape, when the pins 6 are hung to point downwardly, the supporting seats 123 made of plastics provided on the lower shell 12 can effectively support the bended portions 61 of the pins to ensure that the pins 6 will not fall off.

Under normal operating conditions, there is no exertion of excessive force, so as to ensure that the lower shell 12 is not subject to stress, while also ensuring that the pins 6 are fixed in place when inserting or removing the pins. By using the structures described above to fix the pins 6, stress on the lower shell 12 is reduced, so that the lower shell 12 can be prevented from cracking. The present invention improves the quality of the current leakage interrupter by structural improvements of the same, thereby reducing defects of the same.

Figure 10:
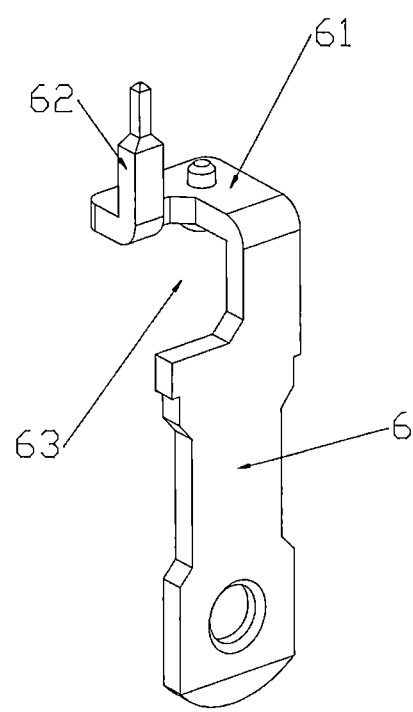
FIG. 10 is a schematic structural view of a pin of the present invention.
Figure 12:
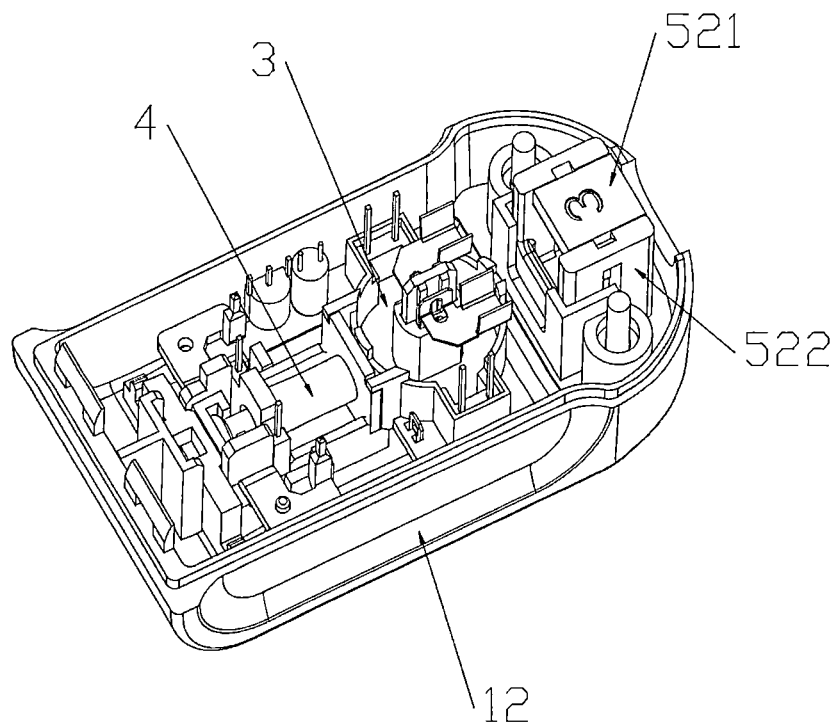
FIG. 12 is a schematic structural view of the present invention with the upper shell and the PCB removed.
Figure 13:
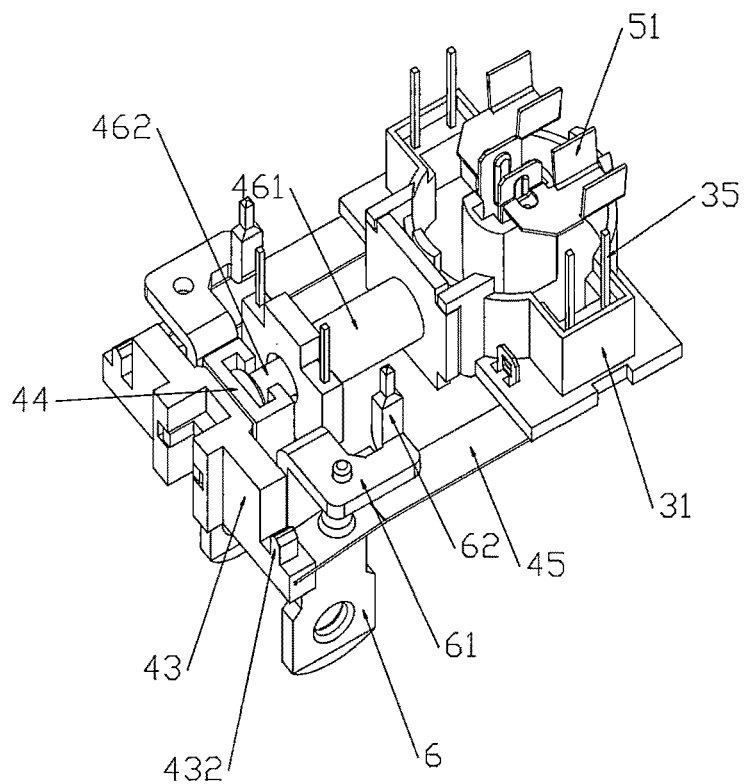
FIG. 13 is a schematic structural view of the trip device and detection device of the present invention.

With reference to FIGS. 10, 12, and 13, specifically, each bended portion 61 of a corresponding pin 6 is bended at said second side of the rear end of the corresponding pin 6, bending away from the trip device 4; a rear end of the bended portion 61 has an extension towards said first side of the rear end of the corresponding pin 6, and a connecting rod 62 is provided at the extension. A hollow space 63 is formed between said first side of the rear end of the corresponding pin 6 and the connecting rod 62; a rear end of the connecting rod 62 has a conical shape, and the connecting rod 62 is inserted into the PCB 2.

The pins 6 and an end of the PCB 2 are in columnar shape, while the rear end of each connecting rod 62 is in conical shape. The columnar shape of the pins 6 is shaped by bending the material of the pins 6 so that the pins can be inserted into the PCB 2, thereby saving the connecting wires between the pins 6 and the PCB 2. The bended portions 61 of the pins 6 are bended towards outer sides of the trip device 4 so that the pins 6 can free some space in the current leakage interrupter due to the configuration of the connecting rods 62, thereby increasing the distance between each pin 6 with respect to an electromagnetic coil. As such, it is not necessary to wrap the electromagnetic coil by insulation sheets (If the pins cannot free some space in the current leakage interrupter, the pins 6 will be very close to the electromagnetic coil on a solenoid bobbin, and in such case, it is necessary to wrap insulation sheets around the electromagnetic coil for insulation. If some space can be freed by the pins, the distance between each pin with respect to the electromagnetic coil is significantly increased). The rear ends of the connecting rods 62 are shaped into conical shape to facilitate insertion into corresponding holes on the PCB 2.

With reference to FIGS. 2, 4, 11-14, specifically, the trip device 4 comprises a reset button 41, a reset spring 42, an actuator 43, a L slider 44, moving contact arms 45, and solenoid assembly; the reset button 41 is configured to pass through the PCB 2 and is spring loaded against the PCB 2 via the reset spring 42; the actuator 43 abuts against a front side of the lower shell 12 (the front side of the lower shell 12 is provided with a sliding groove 124 cooperating with the actuator 43 such that the actuator 43 can slide up and down in the sliding groove 124). The actuator 43 is provided with a buckling groove 431; the L slider 44 is provided with a sliding head 441; the solenoid assembly is provided on the PCB 2 and connected to the L slider 44; the solenoid assembly drives the L slider 44 to move so that the sliding head 441 is released along the buckling groove 431; the reset button 41 is provided with a locking groove 411; The sliding head 441 is provided with a locking portion 442 that locks and holds onto the locking groove 411; one end of each moving contact arm 45 is fixedly connected to the detection device 3, and another end of each moving contact arm 45 is resiliently in contact with the actuator 43. When the sliding head 441 of the L slider 44 locks and holds onto the locking groove 411 of the reset button 41, said another end of each moving contact arm 45 is electrically in contact with the bended portion 61 of a corresponding pin 6.

The L slider 44 is provided with the sliding head 441; the sliding head 441 is shaped as two buckling blocks due to the locking portion 442 disposed in between. When the sliding head 441 of the L slider 44 is fitted into the buckling groove 431 of the actuator 43, the L slider 44 will not fall off. As such, production is facilitated, but tripping will not be affected.

Figure 14:
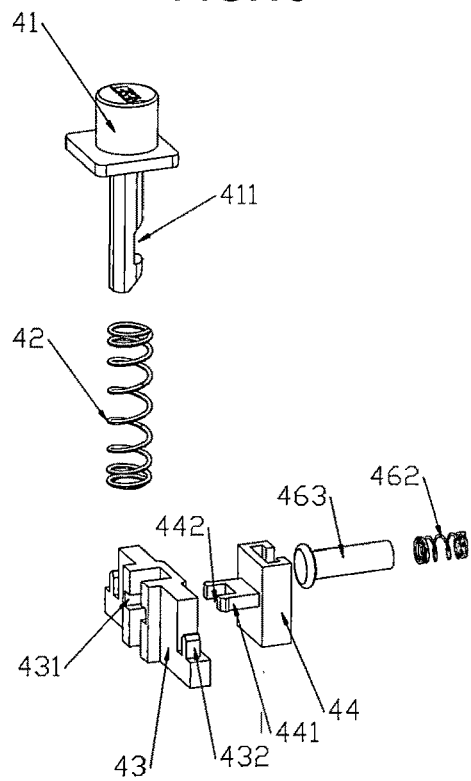
FIG. 14 is an exploded view of the trip device of the present invention.

With reference to FIGS. 2 and 14, specifically, the solenoid assembly comprises a solenoid bobbin 461, a solenoid spring 462, and a linkage shaft 463. The solenoid bobbin 461 is sleeved with an electromagnetic coil; the linkage shaft 463 is disposed inside the solenoid bobbin 461; two ends of the solenoid spring 462 abut against an inner wall of the solenoid bobbin 461 and one end of the linkage shaft 463 respectively; another end of the linkage shaft 463 is connected to the L slider 44.

The linkage shaft 463 is an iron core disposed inside the solenoid bobbin 461; when the electromagnetic coil is energized to generate magnetic field, the linkage shaft 463 can move forward or backward inside the solenoid core 461; when the linkage shaft 463 moves forwardly by the force of solenoid spring 462, the linkage shaft 463 pushes the L slider 44 to abut tightly against the actuator 43, such that the sliding head 441 on the L slider 44 engages the locking groove 411 of the reset button 41 and the actuator 43; when the linkage shaft 463 moves backwardly by the magnetic force, the linkage shaft 463 drives the L slider 44 to move away from the actuator 43, such that the sliding head 441 on the L slider 44 disengages from the locking groove 411 of the reset button 41 and actuator 43.

With reference to FIG. 14, specifically, two sides of the actuator 43 are each provided with a protrusion 432; said another end of each moving contact arm 45 is provided with a notch 451 fitted with the corresponding protrusion 432.

Major functions of the actuator 43 include supporting the moving contact arms 45 and disengaging with the L slider 44. The two sides of the actuator 43 are each provided with the protrusion 432 in conical shape, and each moving contact arm 45 is provided with a corresponding notch 451. During assembly, the notch 451 of the moving contact arm 45 is fitted to the corresponding protrusion 432 of the actuator 43, so as to ensure that the moving contact arms 45 will not be deflected rightward or leftward which may result in touching the plastic shell.

Figure 11:
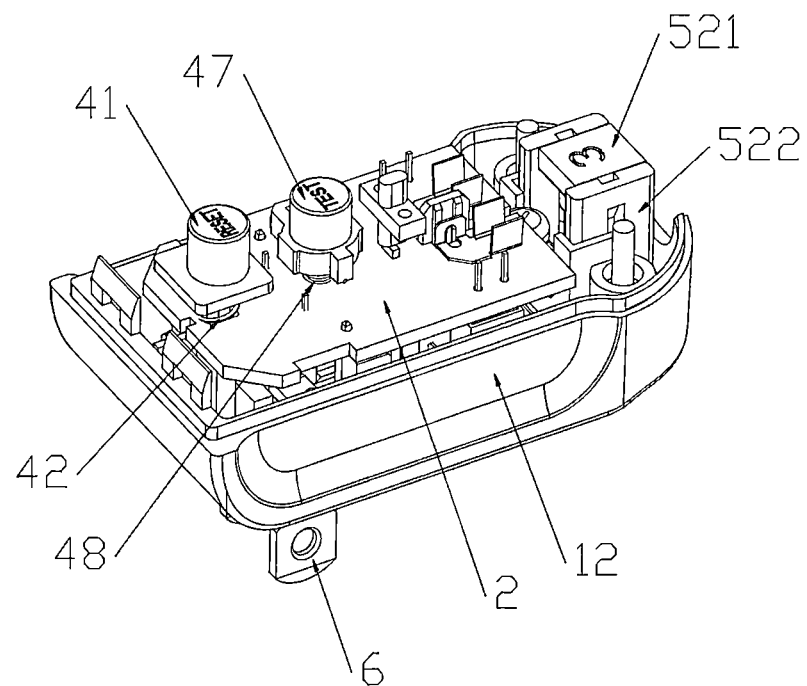
FIG. 11 is a schematic structural view of the present invention with the upper shell removed.

With reference to FIGS. 11-13, specifically, the detection device 3 comprises a transformer; said one end of each moving contact arm 45 extends to pass through a center part of the transformer; the power lines 5 are electrically connected with the moving contact arms 45.

The power lines 5 pass through the center part of the transformer through the moving contact arms 45; the transformer detects the current deviation of the power lines 5.

Figure 15:
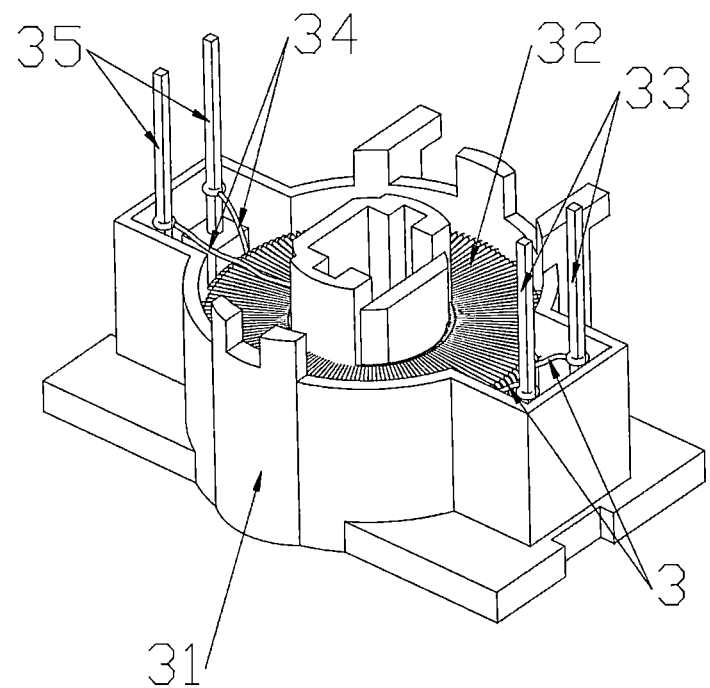
FIG. 15 is a schematic structural view of the transformer of the present invention.

With reference to FIG. 15, specifically, the transformer comprises an outer shell 31, a ring-shaped metal magnetic core 32, a low voltage winding assembly 33, and a high voltage winding assembly 34. The ring-shaped metal magnetic core 32 is placed at a center part of the outer shell 31. The low voltage winding assembly 33 winds around the ring-shaped metal magnetic core 32. Each of the two opposite sides of the outer shell 31 is fixed provided with two metal pins 35. The high voltage winding assembly 34 winds around the ring-shaped metal magnetic core 32 for one to two times, and the two ends of the high voltage winding assembly 34 are connected with the two metal pins 35 respectively at one of the two opposite sides of the outer shell 31. Two ends of the low voltage winding assembly 33 are connected with the two metal pins 35 respectively at another one of the two opposite sides of the outer shell 31. By means of filling using epoxy resin, the outer shell 31 is formed integrally with the ring-shaped metal magnetic core 32, the low voltage winding assembly 33 and the high voltage assembly 34. The metal pins 35 and the PCB 2 are electrically connected.

The transformer is an important constituent component of the current leakage interrupter. The transformer requires a set of winding assembly to detect leakage current. According to a general configuration, the low voltage winding assembly 33 is used to detect leakage current, and a high voltage assembly 34 wire passes through the transformer is used to provide a simulated leakage current. When a test button is pressed, power will be provided, and the simulated leakage current will be generated to pass through the transformer, and hence the transformer detects a leakage current and transmits the signal to the integrated circuit, where works such as amplification are performed inside, thereby eventually driving the silicon controlled rectifier (SCR) and tripping.

In the present embodiment, the high voltage winding assembly 34 winds the ring-shaped metal magnetic core 32 for one to two times, and the two ends of the high voltage winding assembly 34 are connected with the two metal pins 35 at said one of the two opposite sides of the outer shell, while the two ends of the low voltage winding assembly 33 are connected with the two metal pins at said another one of the two opposite sides of the outer shell. Accordingly, one end of the transformer according to the present invention is conventional low voltage output, while another end of the transformer is high voltage output. By means of the above structures, a high voltage line of the leakage current detection is placed inside the transformer, since production process in this regard is transferred to the transformer, even though manual wiring is still required, wiring arrangements on the printed circuit board assembly (PCBA) is not necessary when assembling the current leakage interrupter, and as such, continuous automated production can be achieved. Also, as the low voltage terminal and the high voltage terminal are placed at the two opposite sides of the outer shell 31 respectively, the exposed high and low voltages are sufficiently distanced from each other for the purpose of insulation, thereby satisfying the requirement for safe distance.

By filling the low voltage winding assembly 33 and the high voltage winding assembly 34 using epoxy resin, it is not necessary to consider insulation distance from the perspective of safety regulations (which requires a minimum distance of 3.2 mm). As it is not necessary to consider the distance between high and low voltages, the size of the transformer can be eventually reduced. Also, since the two ends of both the low voltage winding assembly 33 and the two ends of the high voltage winding assembly 34 are lower than a top surface of the epoxy resin used for filling, the problem of damaged and broken wires caused by mechanical impact due to exposure of the ends of the winding assemblies can be completely resolved.

Figure 16:
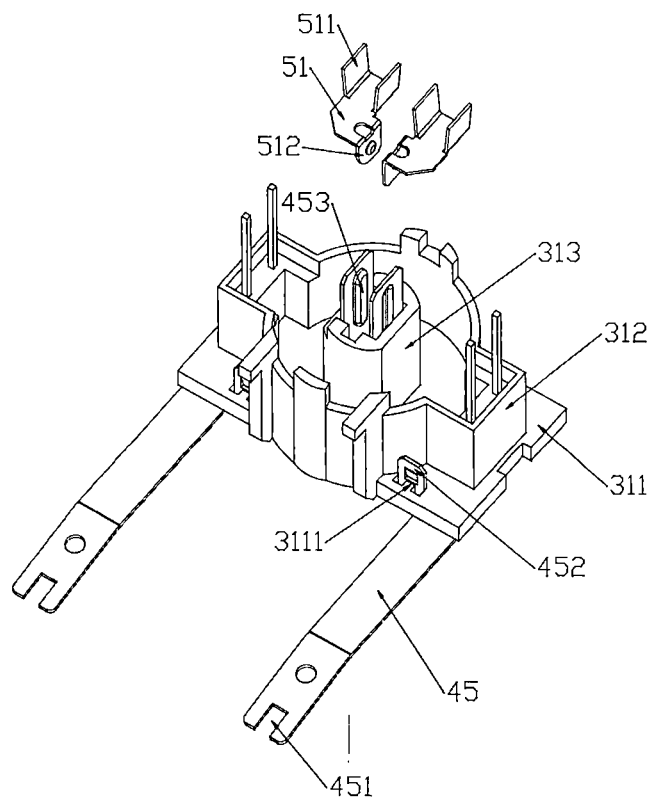
FIG. 16 is a schematic diagram showing the structural connection between the transformer and the moving contact arms according to the present invention.

With reference to FIG. 16, specifically, the outer shell 31 comprises a base board 311 and an enclosure 312 provided on the base board 311; a center part of the base board 311 is provided with a hollow column 313; the ring-shaped metal magnetic core 32 sleeves around hollow column 313; said one end of each moving contact arm 45 extends to pass through the hollow column 313; snap holes 3111 are provided on the base board 311; a snap fit 452 is provided on each moving contact arm 45 to insert into a corresponding snap hole 3111; the inner side of the lower shell 12 is provided with a fixing column 125; two side surfaces of the fixing column 125 are provided with fixing grooves 1251 respectively; said one end of each moving contact arm 45 which is extended is provided with a fixing rib 453 cooperating with a corresponding fixing groove 1251; when the hollow column 313 sleeves onto the fixing column 125, the fixing rib 453 of each moving contact arm 45 is fitted into the corresponding fixing groove 1251 of the fixing column 125.

In the present invention, the transformer is provided with a hollow column 313 and two snap holes 3111; each moving contact arm 45 has a three dimensional L shape; said another end of each moving contact arm 45 is provided with a silver contact and the notch 451, and a middle portion of each moving contact arm 45 is provided with a snap fit 452; said one end of the moving contact arm 45 without the silver contact will first be inserted into the hollow column 313, and then the snap fit 452 of each moving contact arm will insert into the corresponding snap hole 3111 of the transformer. As such, the transformer and the moving contact arms 45 are assembled to form a semi-finished product.

The fixing column 125 is a protruding elongated plastic column at a middle portion of the inner side of the lower shell 12. As mentioned, the two side surfaces of the protruding elongated plastic column are each provided with the fixing groove 1251. Mounting the actuator 43 assembly onto the lower shell 12, and then connecting the semi-finished product consisting of the transformer and the moving contact arms 45 with the lower shell 12 by fitting into the protruding elongated plastic column.

According to the aforementioned structures, the moving contact arms 45 can be effectively fixed in position between the transformer and the lower shell 12, and will not be deflected either upward, downward, rightward or leftward.

With reference to FIGS. 13 and 16, specifically, the power lines 5 are connected with the moving contact arms 45 through wire connection terminals 51; one side of each wire connection terminal 51 is provided with riveting press pieces 511 that connect a corresponding power line 5 by riveting or spot welding; another side of each wire connection terminal 51 is provided with an insertion piece 512 inserted into a gap between a corresponding moving contact arm 45 and the hollow column 313.

When a corresponding power line 5 is disposed at said one side of a corresponding wire connection terminal 51, and the corresponding riveting press pieces 511 press against the corresponding power line 5, the corresponding wire will first be fixed in place by rivet connection, and then the rivet connection is reinforced by spot welding, thereby completing installation of the corresponding wire connection terminal 51; the installed wire connection terminals constitute a semi-finished product.

When the PCB 2 is installed with the transformer, the moving contact arms 45 are disposed at two sides of elongated plastic column of the lower shell 12 respectively. The semi-finished product constituting the installed wire connection terminals can be inserted into the gaps between the moving contact arms 45 and the PCB 2 (i.e. the gaps between the respective moving contact arms 45 and the hollow column 313), and then tin soldering is performed for the purpose of fixing. According to this design, the main current passes through copper pieces of the wire connection terminals 51 and copper pieces of the moving contact arms, whereby the copper pieces of the wire connection terminals 51 and copper pieces of the moving contact arms are in surface contact correspondingly, and are fixed by tin soldering. Therefore, besides fixing two corresponding copper pieces, tin soldering also facilitate electrical connection such that the copper pieces of the wire connection terminals 51 and the copper pieces of the moving contact arms 45 can be properly in contact.

Figure 17:
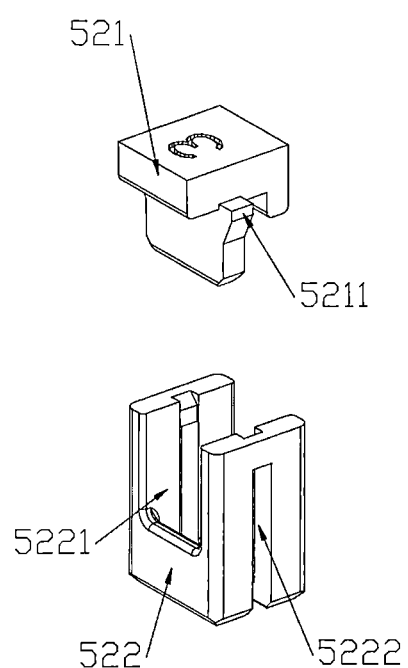
FIG. 17 is a schematic structural view of the wire press block and the wire press seat of the present invention.

With reference to FIG. 17, specifically, a wire press block 521 and a wire press seat 522 that cooperate to press against the power lines 5 are provided inside the shell 1. A wire press groove 5221 is provided on the wire press seat 522. Each of two side walls of the wire press seat 522 is provided with a wire locking groove 5222 that is in communication with the wire press groove 5221. The wire press block 521 is mounted into the wire press groove 5221. Each of two side walls of the wire press block 521 is provided with a wire locking block 5211 that locks into a corresponding wire locking groove 5222.

This wire pressing portion of the present invention is provided with the wire press block 521 and the wire press seat 522 that cooperate to clamp and press against the power lines. As such, the stress of the assembled upper shell and lower shell 12 can be reduced, thereby further increasing the durability of use of the upper shell and the lower shell 12. A cord bushing 53 is provided outside the power lines 5. When the upper shell 11 and the lower 12 are assembled with each other, the upper shell 11 and the lower shell 13 cooperate to clamp the cord bushing 53.

The current leakage interrupter of the present invention has an overall design which is simple and easy to assemble. The upper shell and the lower shell 12 do not have any point of stress, thereby solving the problem of creep deformation and cracking of the plastic shells due to stress.

The working principle of the current leakage interrupter of the present invention is detailed below. It should be understood that, the working principle of a current leakage interrupter should be commonly known by a person skilled in this field of art. The working principle described below is only intended to explain clearly the operating procedures of the current leakage interrupter of the present invention, and should not limit the scope of protection of the present invention.

Figure 18:
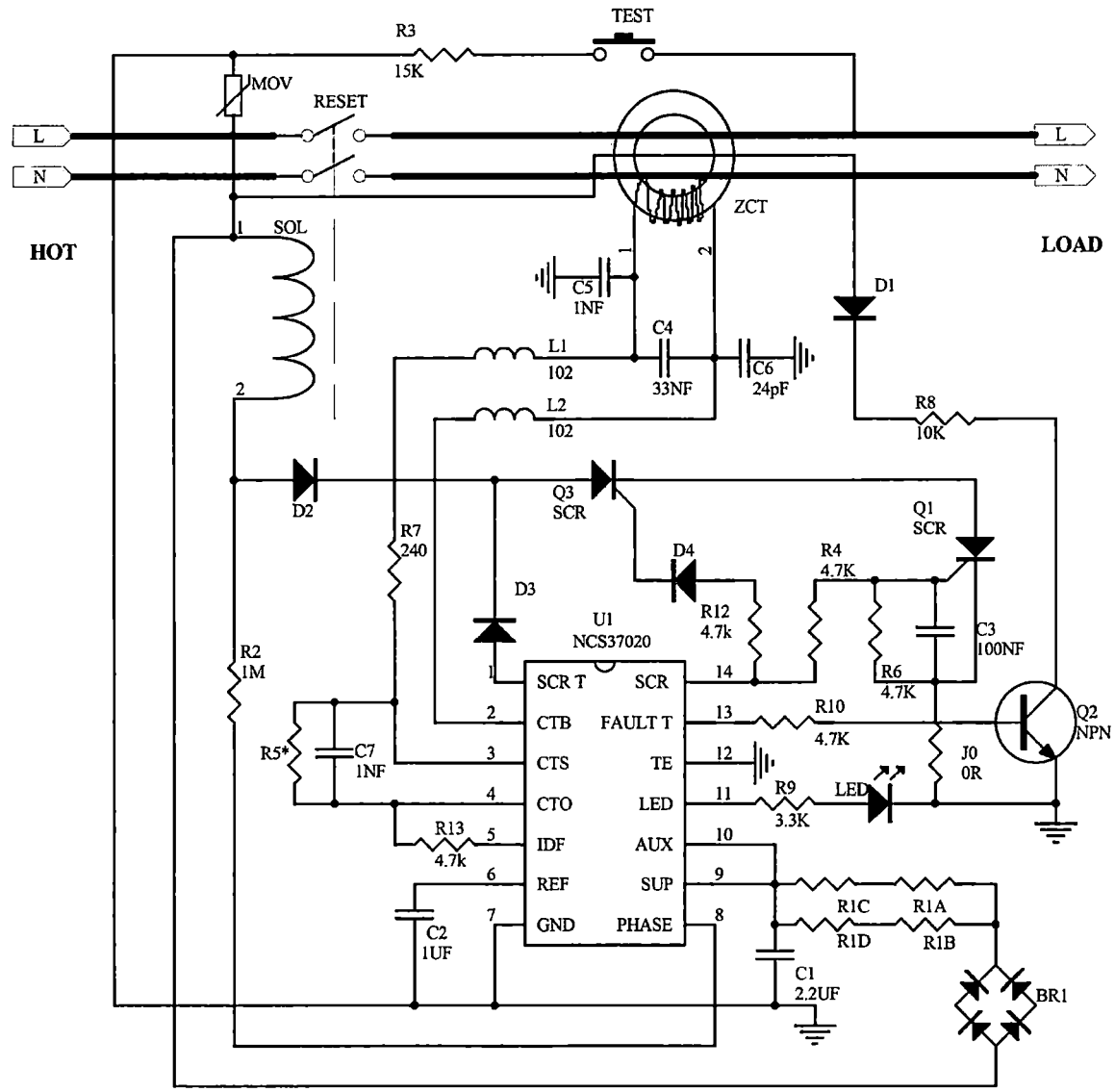
FIG. 18 is a circuit diagram of the current leakage interrupter.

Working Principle from the Perspective of Electronics:

FIG. 18 illustrates a circuit diagram of a current leakage interrupter having automatic detecting function. However, only the current leakage protection will be described below. The automatic detecting function is irrelevant to the scope of the present invention and will not be described herein.

When the current leakage interrupter is connected to a load, current will flow pass the load from L pole to N pole. The in-current and the out-current are equal.

When the in-current and the out-current are balanced, the transformer will not have any reaction. However, when there is a current leakage due to whatever reason, the leaked current will flow pass the human body and then to the ground. Therefore, the in-current will be larger than the out-current. The transformer can detect such tiny difference between the in-current and the out-current, and thus generate a signal which is transmitted to the integrated circuit (IC) where it is amplified. After that, the IC transmits a signal that activates the silicon controlled rectifier (SCR). When the SCR is activated, the solenoid coil is also activated to generate a magnetic field driving the linkage shaft 463. The linkage shaft 463 will thus drive the L slider 44 to trip, and hence, the two moving contact arms 45 will be simultaneously disconnected to cut off the power.

The current leakage interrupter has a test circuit that connects with a test button and a voltage dropping resistor, and passes through the transformer. When the test button is pressed, a simulated leakage current (around 10 mA) will be generated between L/N. When the transformer detects such current leakage current, tripping and power cut off will happen according to the principle described above.

Working Principle from the Perspective of Mechanical Structures:

When the pins 6 are inserted into a socket, current will be generated from the power supplied through the pins, and the current passes through the silver contacts and reaches the moving contact arms 45, wherein the moving contact arms 45 are tightly connected and fixed by tin soldering with the wire connection terminals 51, and the wire connection terminals 51 are connected with the power lines first by rivet connection and then by spot welding. There is a connecting point on each pin 6 directly connected with the PCB 2. The solenoid assembly 46 and the transformer are provided on the PCB 2.

The solenoid spring and the linkage shaft 463 are provided inside the solenoid. The linkage shaft 463 is connected to the L slider 44. The L slider 44 is connected with the actuator 43. In normal operating condition, the linkage shaft 463 is pushed outwardly by solenoid spring, such that the sliding head 441 of the L slider 44 is pushed outward to buckle to the locking groove 411 of the reset button 41. The reset spring 42 is provided inside the reset button 41. The reset spring 42 is coupled to a surface of the PCB 2.

When the reset button 41 is pressed, the reset button is driven downwardly, and as such, the locking groove 411 of the reset button 41 is driven pass the sliding head 441 of the L slider 44. Due to the driving force of the solenoid spring provided inside the solenoid bobbin, the sliding head 441 of the L slider 44 will be driven to buckle to the locking groove 411 of the reset button 41. When the reset button 41 is released, the reset spring will push the reset button 41 upwardly. Since the L slider 44, the actuator 43 and the moving contact arms 45 are synchronic components, when the reset button 41 is pushed upwardly, the L slider 44, the actuator 43 and the moving contact arms 45 will also be driven to move upwardly synchronously. Accordingly, the silver contacts on the moving contact arms 45 will touch the silver contacts on the pins 6, and as such, the current can flow to the moving contact arms 45 and eventually to the product through the silver contacts.

In normal condition where there is no current leakage, the transformer will detect balanced in-current and out-current. Therefore, the current leakage interrupter is fine and will not have any reaction. When there is current leakage, the transformer will detect unbalanced in-current and out-current, and an electronic circuit will activate the solenoid to generate a magnetic field pulling the linkage shaft 463 which in turns pulls the L slider 44; therefore, the sliding head 441 of the L slider 44 disengages from the locking groove 411 of the reset button 41, and so the reset spring will push the reset button 41 to reset upwardly. Since the L slider 44, the actuator 43 and the moving contact arms 45 are synchronic components, when the reset button 41 is disengaged, the L slider 44, the actuator 43 and the moving contact arms 45 will move downward synchronously due to the downwardly spring force of the moving contact arms 45. As such, the silver contacts of the moving contact arms 45 are disengaged from the silver contacts of the pins, thereby cutting off the power of the product.

The current leakage interrupter is provided with a test button 47. The test button 47 is connected resiliently with the PCB 2 through a test button spring 48. When the test button 47 is pressed, the PCB 2 will generate a simulated leakage current (around 10mA) to the transformer. When the transformer detects such simulated leakage current, there will be tripping and power cut off according to the principle described above.

The embodiments given above are only intended to be the description of some preferred embodiments of the present invention, and should not be considered limiting the scope of the present invention. Various modifications and improvements of the technical solutions given in in the present invention by a person skilled in this field of art without deviating from the concept of the present invention should also fall within the scope of protection of the present invention as defined by the claims.

What is claimed is:

1. A current leakage interrupter, comprising a shell formed by mutual connection of an upper shell and a lower shell, a printed circuit board (PCB) provided inside the shell, a detection device and a trip device mounted to the PCB, power lines electrically connected to the trip device through the detection device, and pins electrically connected to the trip device; the lower shell is opened with pin holes; front ends of the pins extend out of the pin holes; wherein a reverse hook is provided at an inner side of the lower shell at an edge of each pin hole to fix tightly onto a first side of a rear end of a corresponding pin; a second side of the rear end of each pin is extended and bended into a bended portion; a supporting seat is also provided at the inner side of the lower shell at the edge of each pin hole to support the bended portion of the corresponding pin; press strips are provided at an inner side of the upper shell to a but against the respective bended portions of the pins.

2. The current leakage interrupter of claim 1, wherein each bended portion of a corresponding pin is bended at said second side of the rear end of the corresponding pin, bending away from the trip device; a rear end of the bended portion has an extension towards said first side of the rear end of the corresponding pin, and a connecting rod is provided at the extension; a hollow space is formed between said first side of the rear end of the corresponding pin and the connecting rod; a rear end of the connecting rod has a conical shape, and the connecting rod is inserted into the PCB.

3. The current leakage interrupter of claim 2, wherein the trip device comprises a reset button, a reset spring, an actuator, a L slider, moving contact arms, and solenoid assembly; the reset button is configured to pass through the PCB and is spring loaded against the PCB via the reset spring; the actuator abuts against a front side of the lower shell; the actuator is provided with a buckling groove; the L slider is provided with a sliding head; the solenoid assembly is provided on the PCB and connected to the L slider; the solenoid assembly drives the L slider to move so that the sliding head is released along the buckling groove; the reset button is provided with a locking groove; the sliding head is provided with a locking portion that locks and holds onto the locking groove; one end of each moving contact arm is fixedly connected to the detection device, and another end of each moving contact arm is resiliently in contact with the actuator; when the sliding head of the L slider locks and holds onto the locking groove of the reset button, said another end of each moving contact arm is electrically in contact with the bended portion of a corresponding pin.

4. The current leakage interrupter of claim 3, wherein the solenoid assembly comprises a solenoid bobbin, a solenoid spring, and a linkage shaft; the solenoid bobbin is sleeved with an electromagnetic coil; the linkage shaft is disposed inside the solenoid bobbin; two ends of the solenoid spring abut against an inner wall of the solenoid bobbin and one end of the linkage shaft respectively; another end of the linkage shaft is connected to the L slider.

5. The current leakage interrupter of claim 4, wherein two sides of the actuator are each provided with a protrusion; said another end of each moving contact arm is provided with a notch fitted with the corresponding protrusion.

6. The current leakage interrupter of claim 5, wherein the detection device comprises a transformer; said one end of each moving contact arm extends to pass through a center part of the transformer; the power lines are electrically connected with the moving contact arms.

7. The current leakage interrupter of claim 6, wherein the transformer comprises an outer shell, a ring-shaped metal magnetic core, a low voltage winding assembly, and a high voltage winding assembly; the ring-shaped metal magnetic core is placed at a center part of the outer shell; the low voltage winding assembly winds around the ring-shaped metal magnetic core; each of two opposite sides of the outer shell is fixedly provided with two metal pins; the high voltage winding assembly winds around the ring-shaped metal magnetic core for one to two times, and the two ends of the high voltage winding assembly are connected with the two metal pins respectively at one of the two opposite sides of the outer shell, and two ends of the low voltage winding assembly are connected with the two metal pins respectively at another one of the two opposite sides of the outer shell; by filling using epoxy resin, the outer shell is formed integrally with the ring-shaped metal magnetic core, the low voltage winding assembly and the high voltage assembly; the metal pins and the PCB are electrically connected.

8. The current leakage interrupter of claim 7, wherein the outer shell comprises a base board and an enclosure provided on the base board; a center part of the base board is provided with a hollow column; the ring-shaped metal magnetic core sleeves around hollow column; said one end of each moving contact arm extends to pass through the hollow column; snap holes are provided on the base board; a snap fit is provided on each moving contact arm to insert into a corresponding snap hole; the inner side of the lower shell is provided with a fixing column; two side surfaces of the fixing column are provided with fixing grooves respectively; said one end of each moving contact arm which is extended is provided with a fixing rib cooperating with a corresponding fixing groove; when the hollow column sleeves onto the fixing column, the fixing rib of each moving contact arm fitted into the corresponding fixing groove of the fixing column.

9. The current leakage interrupter of claim 8, wherein the power lines are connected with the moving contact arms through wire connection terminals; one side of each wire connection terminal is provided with riveting press pieces that connect a corresponding power line by riveting or spot welding; another side of each wire connection terminal is provided with an insertion piece inserted into a gap between a corresponding moving contact arm and the hollow column.

10. The current leakage interrupter of claim 9, wherein a wire press block and a wire press seat that cooperate to press against the power lines are provided inside the shell; a wire press groove is provided on the wire press seat; each of two side walls of the wire press seat is provided with a wire locking groove that is in communication with the wire press groove; the wire press block is mounted into the wire press groove; each of two side walls of the wire press block is provided with a wire locking block that locks into a corresponding wire locking groove.

* * * * *